US010249615B2

(12) United States Patent
Green et al.

(10) Patent No.: US 10,249,615 B2
(45) Date of Patent: *Apr. 2, 2019

(54) MISHFET AND SCHOTTKY DEVICE INTEGRATION

(71) Applicants: Bruce M. Green, Gilbert, AZ (US); James A. Teplik, Mesa, AZ (US)

(72) Inventors: Bruce M. Green, Gilbert, AZ (US); James A. Teplik, Mesa, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/594,286

(22) Filed: Jan. 12, 2015

(65) Prior Publication Data

US 2015/0123168 A1 May 7, 2015

Related U.S. Application Data

(63) Continuation of application No. 13/777,858, filed on Feb. 26, 2013, now Pat. No. 8,946,779.

(51) Int. Cl.
*H01L 27/06* (2006.01)
*H01L 29/423* (2006.01)
(Continued)

(52) U.S. Cl.
CPC ...... *H01L 27/0629* (2013.01); *H01L 21/8258* (2013.01); *H01L 27/0605* (2013.01);
(Continued)

(58) Field of Classification Search
CPC ............... H01L 27/085; H01L 27/0605; H01L 29/7786; H01L 29/1066; H01L 29/517; H01L 29/2003
See application file for complete search history.

(56) References Cited

U.S. PATENT DOCUMENTS 4,390,753 A * 6/1983 Janssen ............... H04M 1/312
379/364
5,286,985 A 2/1994 Taddiken
(Continued)

FOREIGN PATENT DOCUMENTS

CN 101378062 A 3/2009

OTHER PUBLICATIONS

Chen et al., "Fabrication of Enhancement-Mode AlGaN/GaN MISHEMTs by Using Fluorinated Al2O3 as Gate Dielectrics", IEEE Elect Dev. Lett., Oct. 2011, pp. 1373-1375, vol. 32, No. 10.
(Continued)

*Primary Examiner* — Mohammed R Alam (57) ABSTRACT

A semiconductor device includes a substrate comprising a heterostructure configured to support formation of a channel during operation, first and second dielectric layers supported by the substrate, the second dielectric layer being disposed between the first dielectric layer and the substrate, a gate supported by the substrate, disposed in a first opening in the first dielectric layer, and to which a bias voltage is applied during operation to control current flow through the channel, the second dielectric layer being disposed between the gate and the substrate, and an electrode supported by the substrate, disposed in a second opening in the first and second dielectric layers, and configured to establish a Schottky junction with the substrate.

22 Claims, 4 Drawing Sheets

(51) Int. Cl.
  *H01L 29/66* (2006.01)
  *H01L 29/778* (2006.01)
  *H01L 29/812* (2006.01)
  *H01L 21/8258* (2006.01)
  *H01L 27/088* (2006.01)
  *H01L 29/78* (2006.01)
  *H01L 29/20* (2006.01)
  *H01L 29/51* (2006.01)

(52) U.S. Cl.
  CPC ........ *H01L 27/088* (2013.01); *H01L 29/4232* (2013.01); *H01L 29/66462* (2013.01); *H01L 29/7787* (2013.01); *H01L 29/7839* (2013.01); *H01L 29/812* (2013.01); *H01L 29/2003* (2013.01); *H01L 29/51* (2013.01)

(56) References Cited

U.S. PATENT DOCUMENTS

| | | | |
|---|---|---|---|
| 6,529,034 | B1 | 3/2003 | Ranjan |
| 7,821,035 | B2 | 10/2010 | Nomura et al. |
| 7,972,915 | B2 | 7/2011 | Chen et al. |
| 8,035,111 | B2 | 10/2011 | Sheppard |
| 8,076,699 | B2 | 12/2011 | Chen et al. |
| 2006/0197193 | A1 | 9/2006 | Gu et al. |
| 2006/0284247 | A1* | 12/2006 | Augustine ........... H01L 21/8258 257/338 |
| 2007/0018199 | A1 | 1/2007 | Sheppard et al. |
| 2007/0241419 | A1 | 10/2007 | Green et al. |
| 2009/0020823 | A1 | 1/2009 | Fujita |
| 2009/0146191 | A1 | 6/2009 | Green et al. |
| 2009/0230432 | A1 | 9/2009 | Miyashita |
| 2009/0250767 | A1* | 10/2009 | Nomura ............... H01L 21/8252 257/392 |
| 2010/0120237 | A1 | 5/2010 | Tanaka et al. |
| 2011/0018002 | A1* | 1/2011 | Chen ................. H01L 21/28575 257/76 |
| 2011/0057232 | A1 | 3/2011 | Sheppard et al. |
| 2011/0103148 | A1* | 5/2011 | Bhalla ................. H01L 29/1029 365/185.18 |
| 2012/0153301 | A1 | 6/2012 | Shealy et al. |
| 2012/0156836 | A1 | 6/2012 | Shealy et al. |
| 2012/0208365 | A1* | 8/2012 | Kurahashi ......... H01L 21/28264 438/674 |
| 2012/0267637 | A1* | 10/2012 | Jeon .................... H01L 29/0607 257/76 |
| 2012/0319169 | A1 | 12/2012 | Van Hove |
| 2013/0009165 | A1* | 1/2013 | Park .................... H01L 21/8252 257/76 |
| 2013/0043485 | A1* | 2/2013 | Ueno ................ H01L 29/42316 257/76 |
| 2013/0087803 | A1* | 4/2013 | Kizilyalli .......... H01L 29/66462 257/76 |
| 2013/0105808 | A1* | 5/2013 | Wong .................... H01L 29/517 257/76 |
| 2013/0146893 | A1 | 6/2013 | Thei et al. |
| 2013/0146943 | A1* | 6/2013 | Edwards ........... H01L 29/66462 257/192 |
| 2013/0168685 | A1 | 7/2013 | Hsu et al. |
| 2014/0077266 | A1* | 3/2014 | Ramdani ............... H01L 29/513 257/194 |

OTHER PUBLICATIONS

Dong Seup Lee et al., "300-GHz InAlN/GaN HEMTs with InGaN Back Barrier", IEEE Electronc Device Letters, Nov. 2011, pp. 1525-1527, vol. 32, No. 11.

Liu et al., "Improved Linearity for Low-Noise Applications in 0.25-μm GaN MISHEMTs Using ALD Al2O3 as Gate Dielectric", Elect. Dev. Lett., Aug. 2010, pp. 803-805, vol. 31, No. 8.

Marleen Van Hove et al., "CMOS Process-Compatible High-Power Low-Leakage AlGaN/GaN MISHEMT on Silicon", IEEE Electron Device Letters, May 2012, pp. 667-669, Vo. 33, No. 5.

Seshadri Kolluri et al., "N-Polar AlGaN/GaN MIS-HEMTs on SiC with a 16.7 W/mm Power Density at 10 GHz Using an Al2O3 Based Etch Stop Technology for the Gate Recess", IEEE conference publication, 69th Annual Device Research Conference, 2011, pp. 215-216.

Stephan Maroldt, "Gallium Nitride Based Transistors for High-Efficiency Microwave Switch-Mode Amplifiers", Ph. D Dissertation, Albert Ludwigs University, Jun. 2010, 10 pages, Freiburg, Germany.

Toshihiro Ohki et al., "Reliability of GaN HEMTs: Current Status and Future Technology", IEEE conference publication, 47th Annual International Reliability Physics Symposium, 2009, pp. 61-70.

Vetury et al., "Performance and RF Reliability of GaN-on-SiC HEMT's Using Dual-Gate Architectures", International Microwave Symposium Digest, 2006, pp. 714-717.

Wentzel et al., "RF Class-S Power Amplifiers: State of the Art Results and Potential", 2010 International Microwave Symposium Digest, Jun. 2010, pp. 812-815, Anaheim, CA.

Y. Xuan et al., "Capacitance-Voltage Studies on Enhancement-Mode InGaAs Metal-Oxide-Semiconductor Field-Effect Transistor Using Atomic-Layer-Deposited Al2O3 Gate Dielectric", Purdue University, Applied Physics Letters 88, 263518, Jun. 30, 2006, 4 pages.

\* cited by examiner

MISHFET AND SCHOTTKY DEVICE INTEGRATION

CROSS-REFERENCE TO RELATED APPLICATION

This application is a continuation of application of U.S. application Ser. No. 13/777,858, entitled "MISHFET and Schottky Device Integration" and filed Feb. 26, 2013, the entire disclosure of which is hereby incorporated by reference.

FIELD OF INVENTION

The present embodiments relate to semiconductor devices.

BACKGROUND

Gallium nitride (GaN) high electron mobility transistor (HEMT) devices have high breakdown voltages and high cutoff frequencies. Such devices are accordingly useful in high power and high efficiency amplifiers and other devices for high frequency communications and other high frequency applications. HEMT devices are also known as heterojunction field effect transistor (HFET) devices in reference to the derivation of a transistor from a heterostructure.

AlGaN/GaN heterostructures are capable of high speed switching and present high breakdown voltages because of the high breakdown field strength of GaN and the high electron sheet density of the AlGaN/GaN heterojunction. The high breakdown field strength and high electron sheet density arise from the wide 3.4 eV bandgap of GaN. This bandgap is much wider than the bandgap of other semiconductor materials, such as Si (1 eV bandgap) and GaAs (1.6 eV bandgap). Such GaN heterostructures are accordingly often used in devices calling for highly efficient operation.

GaN HEMT devices have suffered from leakage current and trap-related phenomena, such as current collapse and quiescent current drift. GaN HEMT devices may degrade upon the formation of defects in an AlGaN barrier layer of the device. The defects provide a leakage path for electrons and effectively lower the Schottky barrier height of the gate. Current collapse is a frequency dispersion phenomenon, and may result from surface and buffer traps.

Field plates have been used to reduce the electric field at the gate edge. The reduction in the electric field in that region may address issues of device degradation and current collapse. GaN caps have also been used to reduce the electric field at the gate edge and improve surface morphology. Silicon nitride films have also been used to decrease the influence of surface traps in the interest of addressing current slump. Despite these efforts, gate leakage remains a problem for AlGaN/GaN HFET devices with Schottky gates.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Semiconductor devices with integrated MISHFET and HFET or other Schottky structures are described. Methods of fabricating semiconductor devices having integrated MISHFET and Schottky structures via selective etching of surface passivation layers are also described. The disclosed methods and devices may allow the MISHFET and Schottky structures to be available on a single integrated circuit (IC) chip. For instance, the multiple passivation layers may allow the MISHFET and Schottky structures to be realized using the same fabrication process flow.

The MISHFET and Schottky structures may be configured as separate transistor devices (e.g., devices that operate independently of one another) or as a single transistor device (e.g., in which the MISHFET and Schottky structures are disposed adjacent to one another for dependent or cooperative operation). The separate transistor devices may be disposed in a cascode amplifier configuration, a Doherty power amplifier circuit, or other configurations and arrangements. A cascode amplifier may also be realized via MISHFET and Schottky structures configured in a single transistor device having a dual-gate configuration. The disclosed embodiments may support the fabrication of other multiple-gate devices. In still other single transistor embodiments, the disclosed devices may include a MISHFET structure having an integrated Schottky diode via, e.g., a Schottky junction at a source/drain or current electrode. Such integration of the disclosed embodiments may provide the low leakage benefits of a MISHFET device with high frequency and other capabilities and features.

The MISHFET and Schottky structures may be fabricated on a common substrate in a process flow (e.g., a GaN HFET process flow) without the need for an additional mask. The process flow may be configured to fabricate a GaN HFET device in which an etch stop dielectric layer, such as aluminum oxide, is deposited before a dielectric passivation layer, such as silicon nitride. These passivation layers may be patterned to define ohmic contacts for the structures and/or devices. An opening for a Schottky gate or other Schottky junction may then be formed using a dry etch procedure (e.g., fluorine-based chemistry, such as $SF_6$) on the silicon nitride configured to terminate on the etch stop dielectric layer. The etch stop layer may then be removed in the opening via a wet etch procedure, thereby avoiding the surface damage that may occur with the dry etch procedure. One or more metal layers are then deposited in the opening to form a Schottky contact. As described below, another dry etch procedure is implemented to define a gate opening for the MISHFET structure. The dry etch procedure again terminates at the etch stop dielectric layer, such that another metal layer may be deposited in the gate opening to form a MISHFET gate.

Although described below in connection with AlGaN/GaN heterostructures and devices, the selective etching of the disclosed devices and methods is well suited for use in connection with other devices and structures. For example, the disclosed devices may utilize a wide variety of semiconductor materials, including other types of Group III-nitride semiconductor materials (e.g., InAlN and InGaN). The disclosed devices are also not limited to Group III-nitride semiconductors, and may instead include other compound semiconductor materials, such as non-nitride-based compound semiconductors (e.g., GaAs) and Group II-Group VI semiconductor materials.

The disclosed devices are also not limited to devices having HFET structures or device configurations. For example, one or more aspects of the disclosed devices and methods may be applied in connection with MISHFET devices having an integrated Schottky junction. As described below, the Schottky junction may be integrated with the MISHFET structure as a source/drain or current electrode having a Schottky junction (e.g., rather than an ohmic contact). The disclosed devices are accordingly not limited to semiconductor devices or electronic apparatus in which the integration involves coupling multiple transistor structures or devices with one another or otherwise deploying different transistor technologies in respective transistor structures or devices.

The disclosed devices are also not limited to device configurations, circuit arrangements, or electronic apparatus directed to a particular amplifier context, such as a high voltage application or context. The disclosed devices may be used in contexts or applications other than the high frequency, power switching, and other applications noted herein.

Figure 1:
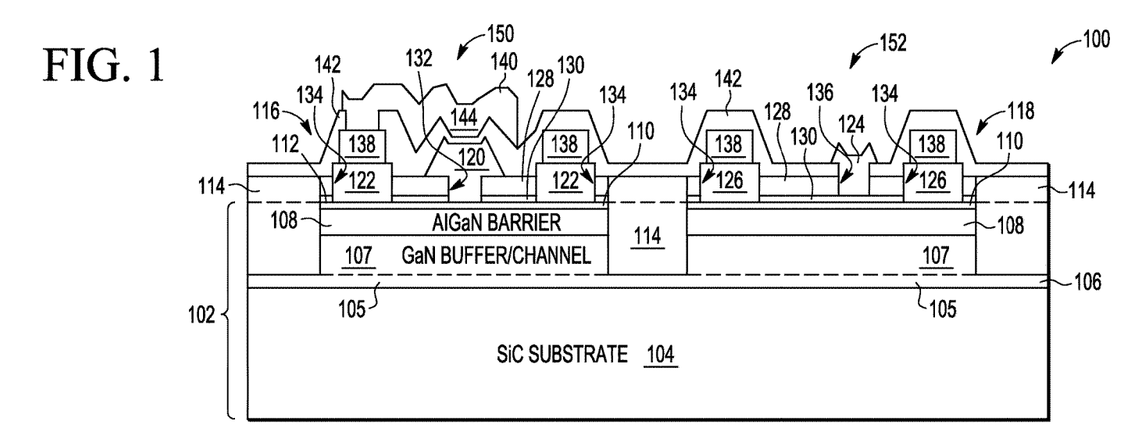
FIG. 1 is a schematic, cross-sectional view of an exemplary semiconductor device having a metal-insulator-semiconductor HFET (MISHFET) structure and an HFET structure integrated in accordance with one embodiment.

FIG. 1 is a schematic, cross-sectional view of an exemplary semiconductor device 100 having an HFET structure 150 and a MISHFET structure 152 integrated in accordance with one embodiment. In this example, the HFET and MISHFET structures 150, 152 are configured as separate or distinct semiconductor devices (e.g., epitaxial GaN transistor devices). The HFET and MISHFET structures 150, 152 are defined in and/or on a common semiconductor substrate 102 having a heterojunction structure or heterostructure on a base substrate 104. In this example, the base substrate 104 includes SiC. The base substrate 104 may include alternative or additional materials, such as sapphire, Si, GaN, AlN, diamond, poly-SiC, SiC on insulator, silicon on insulator, and other substantially insulating materials. The semiconductor device 100 may include any number of HEMT or other semiconductor devices integrated in a single integrated circuit (IC) chip. The manner in, and the degree to which, such devices are integrated with one another may vary, as shown in connection with the exemplary embodiments described herein.

The semiconductor substrate 102 includes a number of semiconductor layers supported by the base substrate 104. The semiconductor layers are configured in a heterostructure arrangement to support the formation of one or more channels in the HFET and MISHFET structures 150, 152 during operation. In this embodiment, respective channels are formed in the HFET and MISHFET structures 150, 152 during operation. Each of the semiconductor layers may be a Group III-nitride semiconductor epitaxial layer. In other embodiments, one or more of the semiconductor layers is not epitaxially grown. In this example, a buffer/channel layer 106 is grown on the base substrate 104 and configured to establish a channel of the transistor device 100 via stress-induced polarization, as described below. A bottom or buffer portion 105 of the buffer/channel layer 106 may include undoped (or not intentionally doped) GaN or GaN doped with a p-type dopant such as C or Fe at a level of about $10^{17}$ to about $10^{19}$ $cm^{-3}$ to render the buffer portion 105 highly resistive. In embodiments in which the bottom portion 105 is doped, the dopants may be intentionally incorporated during the first 0.1 to 1 um of epitaxial growth. Undoped subsequent material may then be grown, albeit with the possible incorporation of doping due to "memory effects" present during growth. Alternatively, the buffer portion 105 of the buffer/channel layer 106 may include $Al_xGa_{1-x}N$ where the Al mole fraction, X, is between 0.03 and 0.06. The thickness of the buffer portion 105 may be between about 0.2 and 5 about microns. The $Al_xGa_{1-x}N$ may be doped or undoped. An upper or channel portion 107 of the buffer/channel layer 106 may be generally an undoped lower bandgap material relative to a barrier layer 108 (e.g. AlGaN), such as GaN or $In_xGa_{1-x}N$ where X is between 0 and 1. The channel portion 107 may be optimized for optimal electron transport and device speed by minimizing the amount of alloy and impurity scattering by avoiding Al-containing alloys or high levels of dopants. The channel portion 107 may have a thickness of about 0.01 to about 1 microns.

The AlGaN barrier layer 108 is contiguous with, and disposed on, the buffer/channel layer 106, and a GaN cap layer 110 is disposed on and adjacent to the barrier layer 108. The AlGaN barrier layer 108 may have a thickness of about 30 Angstroms to about 400 Angstroms, or thicknesses in the range of about 70 Angstroms to about 250 Angstroms. The cap layer 110 defines a surface 112 of the semiconductor substrate 102, and may have a thickness of about 10 Angstroms to about 50 Angstroms. One or more of the buffer/channel, barrier, and/or cap layers 106, 108, 110 may be doped, un-doped, or unintentionally doped.

The stress-induced polarization resulting from epitaxial growth of the AlGaN and GaN layers develops a two-dimensional electron gas at the interface between the layers 106 and 108. The two-dimensional electron gas provides charge carriers in the heterostructure for conduction during operation. The GaN cap layer 110 may provide protection for the layers 106 and 108 during subsequent processing steps and may be configured to lower gate leakage.

Other semiconductor materials may be used in the channel, barrier, and/or cap layers 106, 108, 110 of the heterostructure. In some cases, other Group III-nitride semiconductor materials are used. Such materials may include other binary, ternary, and quaternary compounds. For example, other materials such as InGaN may be used for the channel layer 106 that have a bandgap less than the bandgap of the barrier layer 108, as well as a higher electron affinity than the barrier layer 108. Also, $In_xAl_{1-x}N$, where X may but need not be selected to achieve a lattice match with the channel portion 107 of the buffer/channel layer 106, may be used for the barrier layer 108. One or more of the layers 106, 108, 110 may be a composite layer.

In other embodiments, additional semiconductor layers may be incorporated into the heterostructure arrangement. For example, buffer, nucleation, and/or transition semiconductor layers may be included in the heterostructure in the semiconductor substrate 102. For instance, an AlN interbarrier layer may be used between the barrier layer 108 and the buffer/channel layer 106.

A number of isolation regions 114 are formed in the semiconductor substrate 102 to define active areas 116, 118 along the surface 112 of the semiconductor substrate 102 for the HFET and MISHFET structures 150, 152, respectively. In this example, one of the isolation regions 114 is disposed between the HFET and MISHFET structures 150, 152 to define inner boundaries of the active areas 116, 118, while two other isolation regions 114 define outer boundaries of the active areas 116, 118.

The isolation regions 114 may be formed via an implantation procedure configured to damage the epitaxial and/or other semiconductor layers of the semiconductor substrate 102. In this embodiment, the implantation procedure is performed after one or more passivation layers (described below) are deposited on the surface 112 of the semiconductor substrate 102. The fabrication of the isolation regions may vary. For example, the implantation procedure may be performed before the passivation of the surface 112. The configuration of the isolation regions 114 may also vary. For example, the isolation regions 114 may be configured as isolation trenches filled with one or more dielectric materials. In alternative embodiments, the active area 116 of the transistor device 100 is defined via a mesa-etched structure supported by the base substrate 104 and configured to define the heterojunction active area. The semiconductor substrate 102 may thus include such mesa-etched and other semiconductor structures. A number of alignment marks (not shown) may be formed along the surface 112 outside of the active areas 116, 118.

The HFET structure 150 includes a gate 120 supported by the semiconductor substrate 102 to control current flow through the buffer/channel layer 106 in the active area 116. The gate 120 is disposed on the cap layer 110 and includes an electrode configured to establish a Schottky junction or contact with the heterostructure of the semiconductor substrate 102. A variety of materials may be used to form the Schottky contact of the gate 120, such as one or more of Ni, Pt, $NiSi_x$, Cu, Pd, Cr, W, etc. The gate 120 may be T-shaped, with a vertically oriented stem as shown. In other embodiments, the gate may be recessed stopping in the AlGaN barrier layer or on an AlN interbarrier layer between the AlGaN barrier layer 108 and the buffer/channel layer 106.

The term "electrode" is used herein to include any conductor, conductive layer, or conductive structure, including layers or structures supported by the semiconductor substrate 102 and configured to support current through a region (e.g., a current region) of the semiconductor substrate 102 adjacent thereto. The conductor or other layer or structure of an electrode may include or establish a terminal or a contact of a semiconductor device, such as a source terminal, a drain terminal, or a gate terminal, of a FET device, or a terminal of a diode, such as a Schottky diode.

The HFET structure 150 further includes a pair of electrodes 122 supported by the semiconductor substrate 102 in the active area 116. The gate 120 is disposed laterally between the pair of electrodes 122. The electrodes 122 are spaced from one another to define terminals (e.g., source and drain terminals) of the HFET structure 150 between and through which current flows when the channel is formed by a suitable gate control voltage applied to the gate 120. The electrodes 122 are configured to establish ohmic contacts with the heterostructure of the semiconductor substrate 102. In this example, the electrodes 122 are disposed on the surface 112 of the semiconductor substrate 102 and are thus deposited on the cap layer 110. In other embodiments, the ohmic contacts 122 are formed in recesses in the semiconductor substrate 102, in which case the ohmic contacts may be deposited on, for instance, the barrier layer 108. A variety of one or more metal materials arranged in one or more layers may be used to form the electrodes 122 and establish the ohmic contacts.

The MISHFET structure 152 includes a gate 124 supported by the semiconductor substrate 102 to control current flow through the buffer/channel layer 106 in the active area 118. The gate 124 is disposed in a metal-insulator gate configuration at the surface 112 of the semiconductor substrate 102. The components of the MISHFET structure 152 may thus be configured as a MISHFET device. The insulator layer of the metal-insulator gate configuration is described below in connection with the passivation of the surface 112 of the semiconductor substrate 102.

The MISHFET structure 152 further includes a pair of electrodes 126 supported by the semiconductor substrate 102 in the active area 118. The gate 124 is disposed laterally between the pair of electrodes 126. The electrodes 126 are spaced from one another to define terminals (e.g., current terminals, such as source and drain terminals) of the MISHFET structure 152 between which current flows when the channel is formed by a suitable gate control voltage applied to the gate 124. The electrodes 126 are configured to establish ohmic contacts with the heterostructure of the semiconductor substrate 102. In this example, the electrodes 126 are disposed on the surface 112 of the semiconductor substrate 102 and are thus deposited on the cap layer 110. In other embodiments, the ohmic contacts 122 are formed in recesses in the semiconductor substrate 102, in which case the ohmic contacts may be deposited on, for instance, the barrier layer 108. A variety of one or more metal materials arranged in one or more layers may be used to form the electrodes 122 and establish the ohmic contacts. In some embodiments, the electrodes 126 share a common configuration, and formed via the same fabrication procedures, as the electrodes 122 of the HFET structure 150.

The semiconductor device 100 includes multiple, selectively etched surface passivation layers that are patterned or configured to define the HFET and MISHFET structures 150, 152. In this example, the multiple passivation layers include a first dielectric layer 128 and a second dielectric layer 130. Each dielectric layer 128, 130 may extend across the active area 116 between the electrodes 122 and across the active area 118 between the electrodes 126. Each dielectric layer 128, 130 is supported by the semiconductor substrate 102. One or both of the dielectric layers 128, 130 may be configured for surface passivation.

In the embodiment of FIG. 1, the second dielectric layer 130 is disposed between the first dielectric layer 128 and the surface 112 of the semiconductor substrate 102 in the active areas 116, 118. For example, the first dielectric layer 128 may be spaced from the surface 112 by the second dielectric layer 130. The first dielectric layer 128 may be considered an upper or primary passivation layer, and the second dielectric layer 130 may be considered a lower or intermediary passivation layer. In this embodiment, the second dielectric layer 130 extends across the active areas 116, 118 to passivate the entire surface 112 in the active areas 116, 118, including those portions of the surface 112 over the channel layer 106. The second dielectric layer 130 extends along or covers the surface 112 with the exception of an opening 132 for the gate 120 and openings 134 for the electrodes 122, 126. The gate 120 is disposed in the opening 132 to establish a Schottky junction at the surface 112 of the semiconductor substrate 102, while each electrode 122, 126 is disposed in a respective one of the openings 134. As described below, the surface 112 of the semiconductor substrate 102 may be passivated by a different one of the dielectric layers 128, 130 (e.g., the second dielectric layer 130) in various areas as a result of the patterning thereof.

The first and second dielectric layers 128 and 130 are also selectively patterned to form the MISHFET structure 152. The fabrication of the HFET structure 150 and the MISHFET structure 152 may thus share a number of acts or steps in the fabrication process flow, examples of which are described below. The gate 124 of the MISHFET structure 152 is disposed in an opening 136. In contrast to the HFET structure 150, the opening 136 is formed only in the first dielectric layer 128. The second dielectric layer 130 remains disposed between the gate 124 and the semiconductor substrate 102 to establish the metal-insulator-semiconductor (MIS) configuration.

The surface passivation layers and the selective etching thereof allows the HFET and MISHFET structures 150, 152 to be integrated and based on a common semiconductor substrate (e.g., the semiconductor substrate 102) and heterostructure thereof. The selective etching of the first and second dielectric layers 128, 130 allows both the gate 120 and the ohmic contacts of the electrodes 122, 126 to be formed in a manner that avoids damage to the surface 112 of the semiconductor substrate 102. The selective etching of the passivation layers may avoid the damage that may otherwise occur due to reactive ion etch (RIE), inductively coupled plasma (ICP), or other dry etch procedures used in connection with the formation of the gate 120 (or other Schottky junctions) and the ohmic contacts of the electrodes 122, 126. Damage may be avoided by following up such dry etching of the first dielectric layer 128 with a wet etch of the second dielectric layer 130. The wet etch of the areas for both the ohmic contacts 122 and the gate 120 may thus provide low ohmic contact resistance and low gate leakage, respectively. Gate leakage and inconsistent ohmic contact resistance that may otherwise arise from such damage may thus be reduced. The multiple dielectric layers (e.g., the layers 128, 130) may avoid or address such problems while providing for surface passivation. The selective etching of the multiple dielectric layers may be used in areas other than those involved in the formation of the gates 120, 124, the electrodes 122, 126, and/or other ohmic contacts or Schottky junctions to vary the manner in which the surface 112 is passivated. Surface damage may thus be avoided while still allowing the surface 112 to be passivated in some portions of the active areas 116, 118 by a desired dielectric material, such as silicon nitride ($Si_3N_4$). For these and other reasons, the disclosed transistor devices may have consistently lower gate leakage and ohmic contact resistances.

The selective etching of the dielectric layers 128, 130 may also include or involve different etch procedures for the formation of the MISHFET structure 152. As with the Schottky gate 120 and the ohmic contacts, the second dielectric layer 130 may be wet etched, and act as an etch stop for an RIE procedure used to etch the first dielectric layer 128. Etch damage at the surface 112 from such RIE procedures may thus be avoided. While the absence of etch damage may, in turn, reduce or eliminate gate leakage in the HFET structure 150 or other Schottky junction devices (as well as improve the ohmic contact resistance), integration of the MISHFET structure 152 may further reduce or eliminate problems related to gate leakage. The same dielectric layer used as an etch stop may be used to form the MISHFET structure 152.

The selective etching of the dielectric layers may include or involve various patterning of the dielectric layer 130 configured for use as an RIE etch stop. For example, the surface passivation in the active areas 116, 118 may vary as described herein. The patterning may be used to localize the coverage of the etch stop dielectric layer 130 to selected areas, such as the gate and/or ohmic contact areas and areas proximate thereto to ensure complete coverage of the gate and/or ohmic contact areas. The selective coverage of the etch stop dielectric layer 130 may allow one or more portions of the active areas 116, 118 to be passivated by $Si_3N_4$, the presence of which at the surface 112 may help prevent current collapse. For example, such $Si_3N_4$-based passivation may tend to increase the doping of GaN layers because of nitrogen vacancies at the device surface. In contrast, portions of the active areas 116, 118 in contact with or abutting the gate and/or ohmic contact areas may be passivated by the etch stop dielectric layer 130 so that the etch stop dielectric layer 130 may be used to protect the gate and ohmic contact areas. Such non-nitride surface passivation in areas near the gate area may be useful to avoid a reaction between $Si_3N_4$ and one or more Schottky metals, such as nickel, which may otherwise form a conductive NiSi layer capable of causing leakage at the surface 112.

In some embodiments, the first dielectric layer 128 includes low pressure chemical vapor deposition (LPCVD) $Si_3N_4$. Alternative or additional dielectric materials may be used in the first dielectric layer 128. In some cases, a layer of $Si_3N_4$ may be deposited via a non-LPCVD procedure. Alternatively, $Si_3N_4$ may be deposited using plasma-enhanced chemical vapor deposition (PECVD), sputtering, or atomic layer deposition may be used to form the dielectric layer 128. Other materials such as silicon dioxide ($SiO_2$), silicon oxide (SiO), silicon oxy-nitride (SiON) may be used to form the first dielectric layer 128 using a variety of techniques, such as LPCVD, PECVD, sputtering, or atomic layer deposition. The first dielectric layer 128 may be formed in a multi-layer stack using a variety of materials and techniques, including, for instance, one or more of those referenced above.

The second dielectric layer 130 may be configured as an etch stop layer that also acts as a surface passivation layer. In some embodiments, the second dielectric layer 130 includes a wet etchable material having an etch selectivity to a dry etchant of the first dielectric layer 128. For example, the second dielectric layer 130 may include one or more materials with etch selectivity to fluorine- or fluoride-based and/or other RIE processes used to dry etch $Si_3N_4$. Suitable dry etchants include Tetrafluoromethane ($CF_4$), hexafluoroethane ($C_2F_6$), and Sulfur hexafluoride ($SF_6$). Depending on the etch conditions, oxygen and/or argon may be combined with the dry etchants to prevent polymer formation during the dry etch procedure. The second dielectric layer 130 may thus block the dry etchant from reaching the surface 112 of the semiconductor substrate 102 during formation of the openings 126 and 128. In one example, the second dielectric layer 130 may include aluminum oxide (Al$_2$O$_3$) deposited via an atomic layer deposition (ALD), CVD, or other procedures, some of which may involve temperatures of, e.g., about 200 to about 400° C. The Al$_2$O$_3$ layer may have a thickness that falls in range from about 3 nm to about 40 nm. In other embodiments, the second dielectric layer 130 may be deposited in-situ after (e.g., immediately after) the semiconductor substrate 102 is complete, but before the semiconductor substrate 102 is exposed to ambient conditions (e.g., outside the deposition chamber). Such deposition may be done using CVD, MBE, or MOCVD. For example, the second dielectric layer 130 may include a single amorphous AlN, HfO$_2$, or Al$_2$O$_3$ layer. The second dielectric layer 130 may also include a multi-layer stack in which the Al$_2$O$_3$ or AlN layer has a SiN or SiO$_2$ layer deposited as a top layer for surface protection during processing. In these embodiments, the deposition temperature may be about 200° C. to about 800° C., however, deposition temperatures for the dielectric layer disposed on or in contact with the semiconductor substrate 102 may be less than 600° C. In one example, if the first dielectric layer 128 is selectively etched via a dry etch procedure, e.g., using fluorine- or fluoride-based plasma etchants, the Al$_2$O$_3$ in the second dielectric layer 130 stops the etchant at better than 50:1 etch selectivity to Si$_3$N$_4$.

The second dielectric layer 130 may be etched to form the openings 132 and 134 for the gate 120 and the electrodes 122, 126 using a wet etch procedure configured to avoid damage to the surface 112 of the semiconductor substrate 102. A number of different wet etch processes may be used. In one example, a buffered oxide etch (BOE) procedure is implemented to define the openings 132 and 134. In Al$_2$O$_3$ embodiments, the second dielectric layer 130 may alternatively be removed using a wet etch procedure involving diluted HF.

Additional or alternative dielectric materials may be incorporated into, or used as, the second dielectric layer 130. The additional or alternative materials may also have an etch selectivity to block an etchant of the first dielectric layer 128. One such additional or alternative dielectric material is Hafnium oxide (HfO$_2$). The second dielectric layer 130 may include a mixture of Al$_2$O$_3$ and HfO$_2$, discrete layers of Al$_2$O$_3$ and HfO$_2$, or other combination arrangements. The second dielectric layer 130 is not limited to etch resistant materials. For example, the etch stop dielectric layer may include a dielectric stack including a lower or bottom layer of SiO$_2$ and an upper or top layer of Al$_2$O$_3$ and/or HfO$_2$. The bottom layer may be configured for compatibility with the semiconductor material (e.g., GaN) at the surface 112. The top layer may include SiN to protect the wafer during subsequent processing steps. The resistance to etchants of the material(s) in the second dielectric layer 130 may thus vary.

The wet etch for the gate area 120 is selectively applied to the second dielectric layer 130 to support the formation of the gate 124 of the MISHFET structure 152. After the first dielectric layer 128 is removed to define the opening 136, the wet etch procedure is implemented in a manner that leaves the portion of the second dielectric layer 130 in the opening 136. In the example of FIG. 1, the second dielectric layer 130 is not removed from the surface 112 between the electrodes 126 of the MISHFET structure 152. Use of Al$_2$O$_3$ in the second dielectric layer 130 may provide the passivation function for the device 100 due to the high thermal and chemical stabilities of Al$_2$O$_3$. In other cases, one or more portions of the second dielectric layer 130 between the electrodes 126 but outside of the gate 124 are removed via a wet etch procedure. For example, the wet etch of the second dielectric layer 130 may be implemented before deposition or other formation of the first dielectric layer 128. Such selective patterning of the second dielectric layer 130 may be directed to allowing the first dielectric layer 128 (rather than the second dielectric layer 130) to passivate the surface 112 in portions of the active areas 116, 118 other than at the MISHFET gate 124.

The second dielectric layer 130 need not be the only dielectric layer disposed between the first dielectric layer 128 and the semiconductor substrate 102. In alternative embodiments, one or more additional dielectric layers may be disposed along the surface 112 in the active areas 116, 118. Such layer(s) may be disposed between the first and second dielectric layers 128, 130, below the first and second dielectric layers 128, 130 adjacent the surface 112, or above the first and second dielectric layers 128, 130 (e.g., in contact with and above the first dielectric layer 128).

The exemplary embodiment shown in FIG. 1 includes a number of other structures to facilitate connections to the gates 120, 124 and the electrodes 122, 126. For instance, the semiconductor device 100 may include a patterned metal layer 138 for interconnects or other connections to the electrodes 122, 126. In some cases, the metal layer 138 is also deposited or used to define the gate 120. A second metal layer 140 may then be used to form the gate 124 and/or other structures. The second metal layer 140 may be deposited after the deposition of one or more inter-layer dielectric (ILD) layers 142 may be deposited to isolate the metal layers 136, 138 and/or for device passivation. In this example, the second metal layer 140 is used to define a field plate 144 configured to shield the gate 120 from high voltages applied to one of the electrodes 122 acting as, for instance, a drain terminal of the HFET device 150. The field plate 144 is electrically connected to the other one of the electrodes 122 acting as a source terminal of the HFET device 150. The second metal layer 140 may additionally or alternatively be used to form the gate 124 of the MISHFET device 152. The use of the same metal layer to define both the field plate 144 and the gate 124 may allow the MISHFET device 152 to be formed without adding any masking steps to the fabrication process used to form the HFET device 150, as set forth in connection with the process flow examples described below.

In some embodiments, the MISHFET structure 152 may be configured to form an enhancement mode device. For example, the second dielectric layer 130 may be doped with Fluorine ions to set a threshold voltage level for the enhancement mode device. The dopant concentration level in the second dielectric layer 130 may fall in a range from about $10^{16}$ cm$^{-3}$ to about $10^{19}$ cm$^{-3}$, but other concentration levels may be used. A dopant implantation procedure may be implemented during or after the etching of the first dielectric layer 128 to implant the Fluorine ions into the second dielectric layer 130. Other dopant materials may be used. Alternative or additional adjustments to the threshold voltage of the MISHFET structure 152 may be made via controlling the thickness of the second dielectric layer 130 (e.g., Al$_2$O$_3$). The thickness of the second dielectric layer 130 may be about 3 nm to about 40 nm, or in a range of about 5 nm to about 20 nm, but other thicknesses may be used.

The use of the above-described multiple surface passivation layers allows the HFET and MISHFET structures 150, 152 to be integrated on the same semiconductor substrate 102. In the embodiment of FIG. 1, the HFET and MISHFET structures 150, 152 are integrated to the extent that the structures are formed on the same original substrate 106. The HFET and MISHFET structures 150, 152 utilize the same semiconductor layers within the semiconductor substrate 102 to define respective heterostructures of the HFET and MISHFET structures 150, 152, as well as support the formation of respective channels in the heterostructures.

The integration of the HFET and MISHFET structures 150, 152 is not limited to sharing the semiconductor substrate 102. In addition to the semiconductor substrate 102, the MISHFET structure 152 has a number of components and structures in common with the HFET structure 150. The HFET and MISHFET structures 150, 152 include a number of components formed by the same material layers. For example, the HFET and MISHFET structures 150, 152 utilize the same material layers for surface passivation. The incorporation and selective etching of the surface passivation layers, such as the above-described dielectric etch stop layer (e.g., $Al_2O_3$), allows a Schottky gate to be formed by wet-etching the dielectric etch stop layer after dry-etching the other passivation layer (e.g., SiN). The multiple passivation layers may also provide low substrate damage at the Schottky gate and support the formation of high quality ohmic contacts for electrodes of the HFET and MISHFET structures 150, 152.

The integration of the HFET and MISHFET structures 150, 152 allows HFET and MISHFET devices to be combined in a circuit at a chip or package level. Circuits involving both types of devices may thus avoid having to resort to using multiple chips and connections at, for instance, a printed circuit board (PCB) level.

Figure 3:
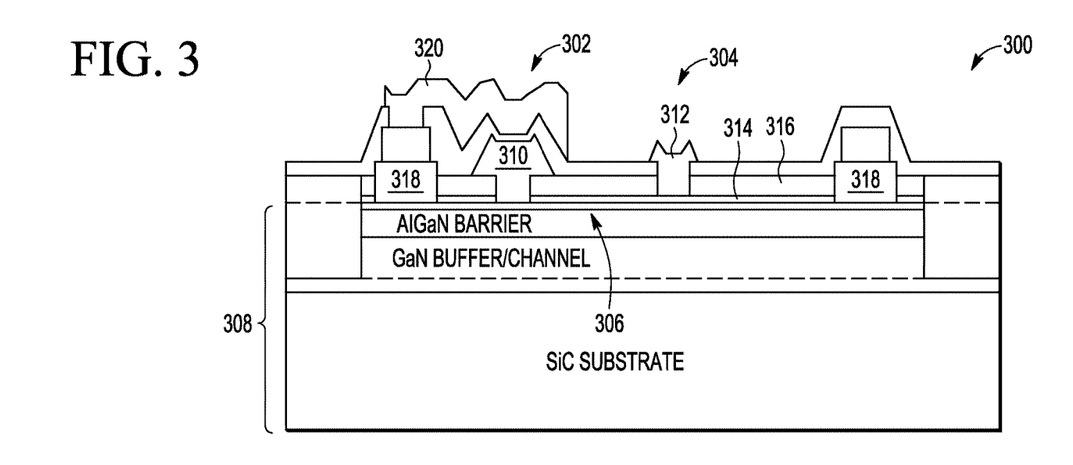
FIG. 3 is a schematic, cross-sectional view of another exemplary semiconductor device having a MISHFET structure and an HFET structure integrated in accordance with one embodiment.
Figure 5:
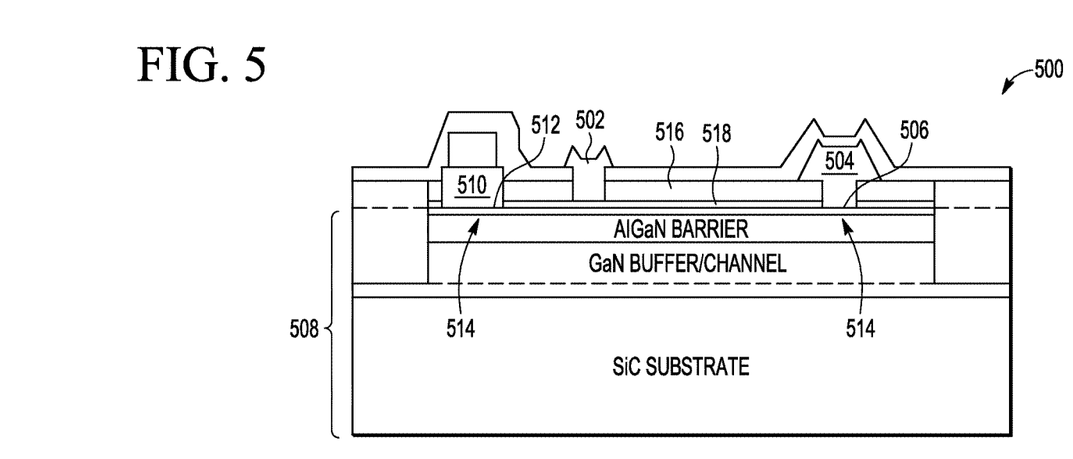
FIG. 5 is a schematic, cross-sectional view of an exemplary semiconductor device having a MISHFET structure and a Schottky diode structure integrated in accordance with one embodiment.

The level, degree, or other characteristics of the integration of the HFET and MISHFET structures 150, 152 may vary from the embodiment shown in FIG. 1. The semiconductor devices shown in FIGS. 3 and 5 provide examples of different levels or types of integration between the HFET and MISHFET structures.

The integration of the HFET structure 150 and the MISHFET structure 152 on the same semiconductor substrate 102 may be useful in a number of different circuit arrangements. In the embodiment of FIG. 1, the electrodes 122 and the electrodes 126 may be connected via interconnects of the patterned metal layer 138 in various arrangements. The electrodes 122, 126 may be connected in such arrangements to define or establish source/drain or current electrodes of the HFET structure 150 and the MISHFET structure 152, respectively. The HFET and MISHFET structures 150, 152 may be coupled to one another in a cascode configuration, in a Doherty power amplifier circuit, or in other amplifier or other circuit arrangements.

Figure 2:
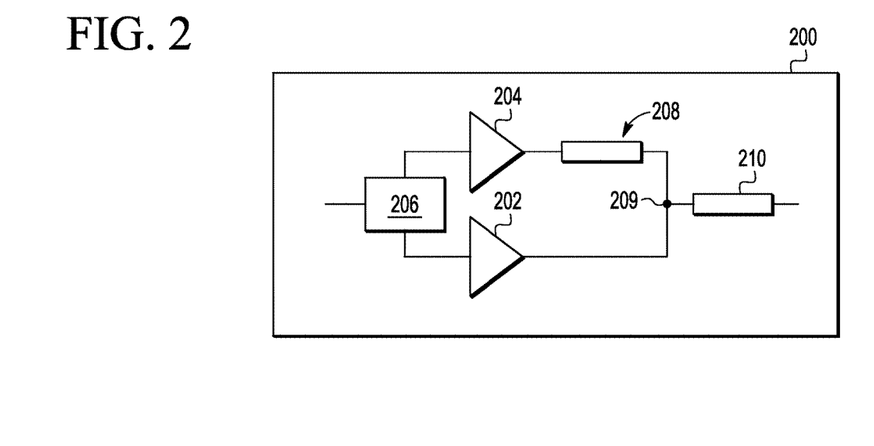
FIG. 2 is a circuit diagram of an exemplary electronic apparatus having an amplifier circuit arrangement in which the MISHFET and HFET structures of the semiconductor device of FIG. 1 are incorporated in accordance with one embodiment.

FIG. 2 depicts an exemplary circuit 200 in which an HFET device 202 and a MISHFET device 204 may be integrated in a single-chip arrangement. The HFET and MISHFET devices 202, 204 may include the HFET and MISHFET structures 150, 152 described above in connection with FIG. 1. In this embodiment, the HFET and MISHFET devices 202, 204 are disposed in a Doherty power amplifier arrangement. In the circuit 200, an input signal is provided to input terminals (e.g., gates) of the HFET and MISHFET devices 202, 204 via a power divider 206. The power divider 206 may split the input signal equally or unequally between the HFET and MISHFET devices 202, 204 and introduce a phase difference (e.g., a 90-degree phase difference) to the input signal driving the HFET and MISHFET devices 202, 204. A resulting output signal is generated by bringing the output of HFET and MISHFET devices 202, 204 back into phase via a 90 degree phase shift transmission line 208 and then recombining the signals at a summing node 209. An impedance transformer 210 is connected at the summing node 209. The impedance transformer is coupled to an external load. The 90 degree phase shift transmission line 208 may be coupled to an output terminal (e.g., a source/drain or current electrode) of the MISHFET device 204 as shown. Alternatively, the 90 degree phase shift transmission line 208 may be coupled to the HFET device 202, or include respective impedance matching components coupled to the HFET and MISHFET devices 202, 204.

The MISHFET device 204 may be configured as a linear carrier amplifier. For example, the MISHFET device 204 may be optimized for operation as a high linearity Class AB carrier amplifier. The HFET device 202 may be configured as a high transconductance ($g_m$) or other peaking amplifier. The HFET device 202 may be configured to operate in a Class C mode. During operation, the linear carrier amplifier operates in a backed-off maximum efficiency mode. During peaks in the signal, the HFET peaking device 202 turns on and injects current into the summing node 209, combining with the current generated by MISHFET device 204, and then turns back off during ensuing periods of reduced signal level.

The circuit 200 may be a single unit of an array of Doherty amplifiers. For example, any number of the circuits 200 may be coupled to one another in a parallel arrangement. Each of the circuits 200 in the array may be disposed on a single IC chip as a result of the integration provided by the disclosed embodiments.

The HFET and MISHFET devices or structures described herein may be disposed in amplifier circuits or arrangements other than the Doherty power amplifier arrangement shown in FIG. 2. For example, the HFET and MISHFET devices or structures may alternatively be disposed in a cascode amplifier arrangement or circuit. In a cascode amplifier arrangement, the HFET and MISHFET structures may be coupled to one another as follows. The gate of the MISHFET structure may be grounded by electrical connection to the source electrode of the HFET structure. The drain electrode of the HFET structure may be electrically tied or connected to the source electrode of the MISHFET structure via an interconnect. Instead of an interconnect or other metal connection, the MISHFET and HFET structures may be adjacent to one another to share a source/drain or current region of the heterostructure, thereby establishing the cascode amplifier arrangement. An example of such integration of the MISHFET and HFET structures is described below in connection with FIG. 3. Alternatively, the HFET and MISHFET structures may share a common electrode or terminal, such as a common Ohmic or other metal layer, to establish the connection.

FIG. 3 depicts an exemplary semiconductor device 300 in which an HFET structure 302 and a MISHFET structure 304 are integrated in a cascode amplifier arrangement. The HFET structure 302 and the MISHFET structure 304 are disposed adjacent to one another to allow the structures 302, 304 to be electrically connected to one another. In this example, the electrical connection is achieved via a source/drain region 306 in a heterostructure of a semiconductor substrate 308. The source/drain region 306 is shared by, or common to, the HFET and MISHFET structures 302, 304, which include respective gates 310, 312. The gate 310 of the HFET structure 302 is configured as a Schottky gate and thus includes a Schottky junction, which may be formed in an opening in a pair of passivation layers 314, 316 as described above. One of the passivation layers 314 acts as an etch stop and remains disposed between the gate 312 of the MISHFET structure and the semiconductor substrate 308, as described above. The shared source/drain region 306 is laterally disposed between the gates 310, 312.

The semiconductor device 300 may be considered or configured as a multiple gate (e.g., dual gate) FET structure. The semiconductor device 300 may include any number of gates. The multiple gate FET structure of the semiconductor device 300 also includes source/drain or current electrodes 318 supported by the semiconductor substrate 308. The source/drain electrodes 318 are spaced laterally outward from the gate 310 (or the Schottky junction thereof) and the gate 312. In this example, a field plate 320 is connected to one of the source/drain electrodes 318 acting as a source terminal for the HFET structure 302. The HFET and MISHFET structures 302, 304 may include a number of other components (e.g., ILD layer(s), metal layer(s), etc.) configured similarly to the other examples described herein.

The HFET and MISHFET structures 302, 304 may be disposed in a cascode configuration (e.g., as a cascode FET device) by connecting the gate 312 to ground. For example, the ground connection may be established via an interconnect between a source electrode of the HFET structure 302 (e.g., the source/drain electrode 318 connected to the field plate 320) and the gate 312.

Figure 4:
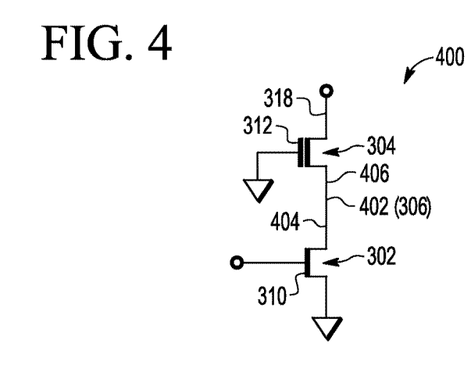
FIG. 4 is a circuit diagram of an exemplary electronic apparatus having a cascode circuit arrangement in which the MISHFET and HFET structures of the semiconductor device of FIG. 2 are incorporated in accordance with one embodiment.

The lengths of the gates 310, 312 and/or the distance between the gates 310, 312 may be adjusted to configure or optimize the operation of the semiconductor device 300 (FIG. 3) and/or a circuit including the semiconductor device 300 (see, e.g., the cascode circuit described and shown in connection with FIG. 4). The lengths of the gates 310, 312 may fall in a range from about 30 nanometers to about 2000 nanometers, but other lengths may be used. Alternatively or additionally, the distance between the gate 312 and the source/drain electrode 318 acting as a drain terminal may provide another design parameter for the semiconductor device 300. The distance between the gate 312 and the source/drain electrode 318 may fall in a range from about 0.5 microns to about 20 microns, but other distances may be used.

The threshold of the MISHFET structure 304 may be controlled through modifications to the dielectric layer 314 (e.g., $Al_2O_3$), including thickness control, fluorine or other dopant implantation, and any combination thereof.

FIG. 4 depicts a circuit 400 representative of the cascode configuration of the semiconductor device 300 (FIG. 3). The circuit 400 includes an electrical connection 402 of a drain 404 of the HFET structure 302 and a source 406 of the MISHFET structure 304 established via the common source/drain or current region 306. In the example of FIG. 3, the HFET and MISHFET structures 302, 304 do not include an electrode or other metal connection to the common source/drain region 306 between the HFET drain 404 and the MISHFET source 406. Alternatively, the semiconductor device 300 includes an ohmic contact to the common source/drain region 306 between the HFET drain 404 and the MISHFET source 406 and, in some cases, one or more metal interconnects, such as an ohmic metal or other suitable metal, to establish the electrical connection 402. In such cases, the cascode amplifier arrangement thus need not be based on a dual-gate or other multiple-gate structures. With such electrodes or interconnects for the electrical connection 402, the HFET and MISHFET structures 302, 304 also need not be adjacent, and instead may be spaced apart to a desired extent.

In the cascode circuit 400, the gate 312 of the MISHFET structure 304 is connected to ground in a common gate configuration. The source 406 of the MISHFET structure 304 is connected to the drain 402 of the HFET structure 302. The ground connection may be made via the electrode of the source/drain electrodes 318 acting as the source terminal of the HFET device 302 (e.g., the electrode connected to the field plate 320 in FIG. 3). An input signal is provided to the gate 310 of the HFET structure 302, and an output signal is generated at the source/drain electrode 318 of the MISHFET structure 304 not shared with the HFET structure 302.

In some cases, the cascode circuit or device 400 may be configured as a fast-slow cascode amplifier. In this configuration, the common source "fast" HFET structure 302 is realized using a relatively short gate length, e.g., in the range from about 50 to about 400 nm, though other gate lengths may be used, to obtain a maximally high $f_T$. The common gate "slow" MISFET structure 304 is configured with a relatively longer gate, e.g., in the range from about 200 to about 2000 nm, while other gate lengths may be used. In this configuration, the current gain and $f_T$ of the overall cascode device 400 is maximized because the common source device of the cascode device 400 is realized with the HFET structure 302 that only withstands a voltage approximately equal to the threshold voltage (typically 5-10V) of the MISHFET structure 304. Therefore, the HFET structure 302 may use a very short gate length and achieve high $f_T$. At the same time, the breakdown voltage of the device is maximized because the MISHFET structure 304 uses a relatively longer gate length as compared to the HFET structure 302. The longer gate length increases breakdown voltage of the HFET structure 304 as well as the overall cascode device 400. Accordingly, the fast-slow configuration of the cascode circuit 400 provides simultaneously high $f_T$ and breakdown voltage. The cascode amplifier may be used to boost impedance and/or breakdown voltage in RF MMIC applications. The integration of the HFET and MISHFET structures in the disclosed embodiments may allow the cascode amplifier to be provided without involving a second bias voltage or needing a metal-insulator-metal (MIM) capacitor for the common gate device.

The presence of the MISHFET structure 304 in the cascode circuit 400 may reduce or prevent the gate leakage presented by typical HFET-based cascode arrangements. During operation, the gate 312 of the MISHFET structure 304 may exhibit low leakage, thereby reducing off-state power consumption, which is often undesirably high due to gate leakage of the common gate device in typical HFET-based cascode arrangements.

FIG. 5 depicts another exemplary semiconductor device 500 having integrated Schottky and MISHFET structures. In this example, the semiconductor device 500 includes a MISHFET gate 502, a source/drain or current electrode 504 configured to establish a Schottky junction 506 with a semiconductor substrate 508, and a further source/drain or current electrode 510 configured to form an ohmic contact 512 with the semiconductor substrate 508. The source/drain electrodes 504, 508 are supported by the semiconductor substrate 508 and spaced from the MISHFET gate 502 to define a MISHFET structure with source/drain or current regions 514 of a heterostructure of the semiconductor substrate 508. The source/drain electrodes 504, 510 are disposed in respective openings in first and second dielectric layers 516, 518 and configured to define the Schottky junction 506 and the ohmic contact 512, respectively, corresponding to current (e.g., drain and source) regions 514 of the semiconductor substrate 508. In some cases, the source/drain electrode 504 may be configured as a Schottky drain of the semiconductor device 500. The Schottky junction 506 may be disposed at an alternative electrode or portion of the semiconductor device 500 in alternative embodiments. For example, the Schottky junction 506 may be disposed as a protection diode between the semiconductor device 500 and an input/output terminal (e.g., a pad or pin of an IC chip).

As described above, the selective etching of the first and second dielectric layers 516, 518 may be used to integrate the Schottky drain 504 within the MISHFET structure. The first and second dielectric layers 516, 518 may be used for surface passivation, with the second dielectric layer 518 configured as an etch stop dielectric layer (e.g., $Al_2O_3$). The Schottky drain 504 and the other source/drain electrode 510 may be formed by wet etching the etch stop dielectric layer after dry etching the first dielectric layer 516 (e.g., SiN). The presence of the etch stop dielectric layer 518 during the dry etching may provide low damage at the Schottky junction 506 and at the ohmic contact of the source/drain electrode 510. The presence of the etch stop dielectric layer 518 may be used to form the MISHFET gate 502 after using the dry etch to define an opening. The MISHFET gate 502 may be created without additional masking steps by using the field plate or other metal layer as described above. In some cases, the semiconductor device 500 may be configured as a quasi-enhancement mode device by implanting Fluorine ions into the etch stop dielectric layer 518 during or after the dry etch step, as described above.

Figure 6:
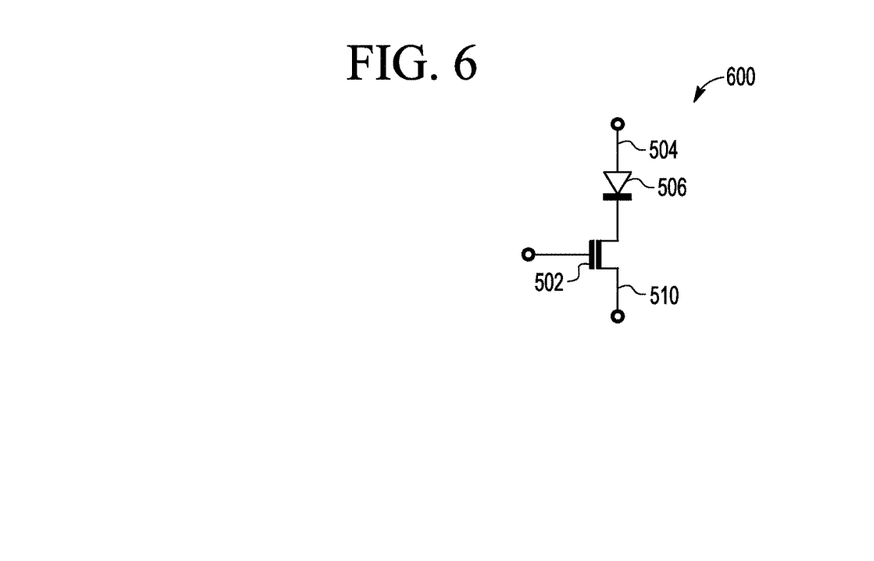
FIG. 6 is a circuit diagram of the semiconductor device of FIG. 5.

FIG. 6 depicts a circuit representation 600 of the integration of the MISHFET gate 502 and the Schottky junction 506 at the source/drain electrode 504. As described above, the Schottky junction 506 may disposed at a drain electrode, while the other source/drain electrode 510 may disposed at a source electrode. The arrangement of the source and drain electrodes may differ, and the placement of the Schottky junction 506 may vary, in alternative embodiments. For example, the integration of the disclosed embodiments may be applied in other serial arrangements of a Schottky diode and MISHFET device.

The above-described integration may be used to deploy Schottky diodes and high speed devices formed by the MISHFET structures on the same IC chip. Integration on the same IC chip may minimize parasitic inductive effects and provide other benefits. For example, the Schottky diodes may be configured to provide wave shaping, protection against inductive ringing, and other functionality. The integration may be used to provide very highly scaled, high frequency (e.g., over 100 GHz) devices, which may be configured for use as class-S or switch-mode amplifiers. Such amplifiers and other devices may benefit from the thin gate dielectric provided by the etch stop dielectric layer, which may prevent excessive gate leakage and/or maximize current for, e.g., recessed gate devices. The class-S amplifiers may use the Schottky diodes to protect final stage transistor devices, e.g., from negative swings of the drain voltage. The disclosed embodiments may be used in other high frequency applications, such as those that convert analog radio frequency (RF) signals (e.g., 0.01 to 2.5 GHz or higher) to square pulses for subsequent amplification before RF reconstruction.

The etch stop layer, e.g., the second dielectric layer 130, may be patterned to customize or optimize the surface passivation. With such patterning, the area(s) in which surface passivation is achieved via the etch stop layer may be localized. For example, the etch stop layer may be limited to areas or portions of the active area in the vicinity of the openings for the gate and/or ohmic contacts. Other portions of the active area may thus be covered and passivated by the other dielectric layer (e.g., a $Si_3N_4$ layer). Such patterning may retain one or more of the advantages of the wet-etched dielectric layer (e.g., $Al_2O_3$) while allowing for the benefits of other surface passivation layers in areas spaced from gate and/or ohmic contact areas. For example, allowing $Si_3N_4$ to passivate the surface of the semiconductor substrate may be useful in embodiments having a Group III-nitride semiconductor material such as GaN defining the surface. The presence of LPCVD $Si_3N_4$ at the surface tends to dope the surface n-type from, e.g., nitrogen vacancies due to the sublimation of GaN, which may occur at temperatures around 675° C. Such extra n-type doping reduces the onset of current collapse in the device. Further details regarding the use of surface passivation of GaN-based transistor devices is set forth in U.S. Patent Publication No. 2007/0241419 ("Transistor and Method with Dual Layer Passivation"). Limiting the lateral extension of the etch stop dielectric beyond the gate area and/or ohmic contact areas may also be useful to the extent that, for instance, a possibility of charge buildup in $Al_2O_3$ exists. In some cases, the etch stop layer may only be present between the gate and drain. With no $Al_2O_3$ in the source region at all, the configuration may be useful for minimizing source resistance. Using LPCVD $Si_3N_4$ only in the source region may minimize contact resistance because LPCVD $Si_3N_4$ passivated material has lower sheet resistance than $Al_2O_3$ passivated material. Further details regarding such patterning of the etch stop dielectric layer are provided in U.S. patent application Ser. Nos. 13/533,610 and 13/533,651, each of which is entitled "Semiconductor Device with Selectively Etched Surface Passivation."

Figure 7:
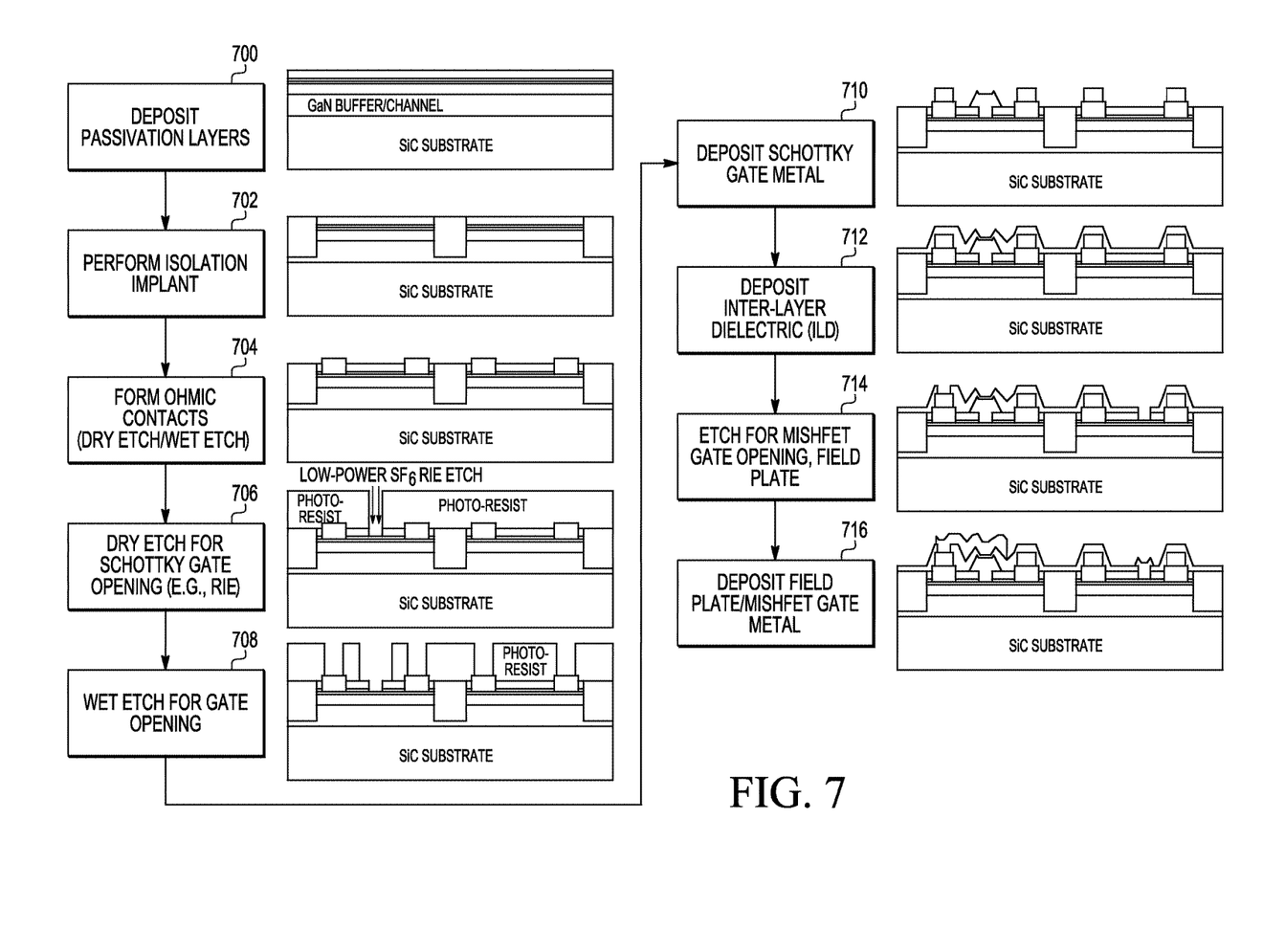
FIG. 7 is a process flow diagram and corresponding schematic, cross-sectional views to illustrate an exemplary method of fabricating a semiconductor device having integrated MISHFET and HFET (or other Schottky junction-based) structures in accordance with one embodiment.

FIG. 7 shows a process flow diagram and corresponding schematic, cross-sectional views to illustrate an exemplary method of fabricating a semiconductor device having integrated MISHFET and HFET (or other Schottky junction-based) structures involving selective etching of surface passivation layers in accordance with one embodiment. The ordering of the acts may vary in other embodiments. For example, an isolation implant procedure may be implemented before the deposition of one or more passivation layers.

The method includes a sequence of acts, only the salient of which are depicted for convenience in illustration. For example, the method may include a number of acts directed to preparing a base substrate (e.g., SiC) or the growth of a number of epitaxial semiconductor layers on the base substrate. The epitaxial semiconductor layers may be grown via one or more techniques, including, for instance, molecular beam epitaxy (MBE), metal-organic chemical vapor deposition (MOCVD), and hydride vapor phase epitaxy (HVPE). The growth of the epitaxial semiconductor layers establishes the heterostructure in which the channel is defined as described above. In this example, the channel is defined by growing a GaN or other epitaxial Group III-nitride semiconductor layer on the base substrate. One or more additional epitaxial Group III-nitride semiconductor layers may be grown on the GaN channel layer to define, for instance, a barrier layer and a cap layer. With the growth of these and/or other semiconductor layers, the surface of the semiconductor substrate is defined for an active area of the semiconductor device. One or more of the channel, barrier, and/or cap layers may be deposited via non-epitaxial techniques.

Passivation of the surface begins with the deposition of an etch stop dielectric layer on the surface across the active area in act 700. The etch stop dielectric layer may include $Al_2O_3$. In one example, the surface (e.g., a GaN surface) is covered with a layer of $Al_2O_3$ having a thickness of about 3 nm to about 40 nm, or a thickness in the range of about 10 nm to about 30 nm. The act 700 may include the deposition of alternative etch stop materials ($HfO_2$) and/or additional dielectric materials ($SiO_2$). For example, the etch stop dielectric layer may include a dielectric stack including a lower or bottom layer of $SiO_2$ or other wet-etchable dielectric film and an upper or top layer of $Al_2O_3$ and/or $HfO_2$. The deposition of the etch stop dielectric layer(s) may be implemented via atomic layer deposition (ALD), PECVD, sputtering, evaporation, LPCVD, electron-cyclotron resonance (ECR) deposition, inductively coupled plasma (ICP), hot-wire CVD (HWCVD), catalytic CVD (CAT-CVD), MOCVD, MBE, HVPE, or other suitable procedure including deposition of these materials in-situ after (e g, immediately after) epitaxial layer growth, but before exposure to ambient conditions.

The act 700 includes further surface passivation with the deposition of a passivation layer on the etch stop dielectric layer. The passivation layer may include $Si_3N_4$ deposited via a LPCVD procedure. The passivation layer extends across the active area over the channel. In some embodiments, the $Si_3N_4$ is deposited via a technique other than an LPCVD procedure or may include more than one layer deposited by one or more techniques. For example, atomic layer deposition (ALD), PECVD, sputtering, evaporation, LPCVD, electron-cyclotron resonance (ECR) deposition, inductively coupled plasma (ICP), hot-wire CVD (HWCVD), catalytic CVD (CAT-CVD), MOCVD, MBE, HVPE or other suitable procedure including deposition of these materials may be used. In addition, the LPCVD SiN surface passivation may take place after (e.g., immediately after) the deposition of the etch stop dielectric layer in the same deposition tool, but before exposure to ambient conditions. Materials including the epitaxial semiconductor layers, etch stop layers, and passivation layers may be deposited in-situ in the same or separate chambers of one tool without exposing the semiconductor substrate to ambient conditions.

The LPCVD procedure may be configured to avoid crystallization of the etch stop dielectric layer. For example, the etch stop layer may begin to crystallize at about 800° C. for $Al_2O_3$. Unfortunately, the quality of LPCVD $Si_3N_4$ may begin to degrade at about that temperature, with significant decreases in quality possible by about 700° C. The LPCVD procedure may thus be implemented at a temperature between about 700° C. and about 800° C. In some embodiments, the LPCVD temperature is about 750° C.

The active area is defined in act 702 via patterning of a photoresist layer and implantation of isolation regions. A number of alignment marks may be deposited outside of the active area before the implantation. The alignment marks may be formed using Si, Titanium-Platinum or other combination or material that provides suitable optical contrast or electron diffraction for e-beam alignment and withstands high-temperature anneals. After the isolation implant and alignment mark deposition, the photoresist may then be removed.

In act 704, ohmic contact areas may be defined for source/drain electrodes by dry etching the LPCVD $Si_3N_4$ of the passivation layer. In preparation for the dry etch or RIE procedure, a layer of photoresist is applied and patterned as shown. Various plasma etchants may then be used to remove the passivation layer, including, for instance, Fluorine-based etchants, such as $SF_6$, $CF_4$, etc. In some cases, the etch procedure forms AlF on the surface of the $Al_2O_3$ layer, thereby stopping the SiN etch. The dry etch procedure may be implemented at a sufficiently low power level (e.g., corresponding with about 30 to about 100 Volts DC bias) to avoid remote damage to the underlying layers (e.g., by passing through the $Al_2O_3$ etch stop layer).

Once the openings in the LPCVD $Si_3N_4$ of the passivation layer are formed, the etch stop dielectric layer may be removed in the ohmic contact areas via a wet etch procedure of the act 704. Various wet etchants may be used, including, for instance, HF, BOE, and hot HCl. One or more etchants may be used in connection with embodiments having a dielectric stack beneath the LPCVD $Si_3N_4$ layer. In addition, the ohmic contacts may be recessed using Cl-based chemistry such as $Cl_2$, $BCl_3$, $SiCl_4$ or other suitable dry or wet chemistry that etches Group III-V nitrides.

To form the source/drain electrodes, one or more ohmic contact metals and/or other materials are deposited in the ohmic contact openings via evaporation, sputtering, or other procedures. For example, the procedure may include evaporating Silicon to cover the surface of the semiconductor substrate in the contact area before one or more metals may be evaporated (e.g., Titanium and Aluminum), thereby forming a silicide at the interface. Once the metal layers are deposited, a lift-off is implemented to remove the photoresist and metals from outside of the ohmic contact areas. Formation of the ohmic contacts may then include the implementation of an anneal procedure. In one embodiment, the ohmic metal layers are annealed at less than 825° C. In another embodiment, the ohmic metal layers are annealed at less than 800° C. In still other embodiments, the ohmic metal layers are annealed at less than 750° C. The anneal time is optimized to reduce ohmic contact resistance and may last between about 30 and about 90 seconds, although shorter or longer times may be used.

The configuration, materials, and other characteristics of the ohmic contacts may be selected to allow the anneal temperature to stay below the crystallization temperature of the etch stop dielectric layer. Implementing the anneal procedure at an anneal temperature lower than 800° C. may avoid such crystallization and thus the creation of leakage paths. In some cases, the quality of the etch stop dielectric material may begin to degrade at about 800° C. The anneal temperature may thus be set between about 700° C. and about 800° C., a range in which low-temperature ohmic contact configurations remain available. In some embodiments, the anneal temperature is about 750° C. to match the temperature of the LPCVD procedure described above. For instance, the formation of the ohmic contact may include creating a recess in the semiconductor substrate before the evaporation of ohmic contact materials. Alternative or additional materials may be used, including the evaporation of silicon into a recess, or the evaporation of Tantalum as a first metal layer instead of Titanium.

Act 706 is the first of several acts or process steps directed to forming a Schottky gate or other Schottky junction of the device. In this example, a Schottky gate area is defined by patterning a photoresist layer and dry etching the $Si_3N_4$ passivation layer. The RIE procedure may define the stem of the gate. Any one of the plasma etchants referenced above may be used, such that the etch is again stopped by the $Al_2O_3$ layer. The etch stop dielectric layer may then be removed in the Schottky gate area via a wet etch procedure in act 708 using one of the wet etchants referenced above. A Schottky gate contact is then formed in the Schottky gate area in act 710. One or more gate metal layers may be deposited via evaporation, sputtering, or other techniques. In one embodiment, the gate metals include Nickel (Ni) and Gold (Au), with an optional Palladium (Pd) layer deposited on the Ni—Au structure. Other suitable Schottky metals may be used. Other good conducting metals may be used as an alternative or in addition to the Au layer. The gate metal layer(s) may also be deposited on the ohmic contact structures as shown. A metal lift-off procedure is then implemented to remove the photoresist layer.

After deposition of the Schottky contact metal layer(s), SiN and/or another inter-layer dielectric (ILD) layer is deposited in act 712. The ILD layer may be deposited by sputtering or some other procedure for depositing, e.g., low hydrogen films.

In act 714, both the ILD layer and the first dielectric layer are dry etched to define an opening for the MISHFET gate. The dry etch may use Fluorine-based RIE chemistry. As described above, the dry etch stops on the etch stop dielectric layer to define the MISHFET gate contact opening. The mask used to define the opening may also be used to define one or more other metal structures of the device. In this example, a contact opening for a field plate of the HFET structure is also defined. Alternatively or additionally, the mask may be used to define one or more catch pads of the device in which through wafer source vias are etched through the wafer and stop on a highly refractive metal etch stop layer. Further details regarding such catch pads are set forth in U.S. Patent Publication No. 2012/0175777. Through this use of the field plate mask, the integration of the disclosed embodiments may be provided without adding another mask step to the process flow.

A cleaning procedure may be implemented after the gate opening is defined. The cleaning procedure may be configured to clean the device surface prior to gate metal deposition. For example, dilute HCl may be used at room temperature to minimally etches the $Al_2O_3$ or other etch stop dielectric layer. Other cleaning compounds may be used.

In act 716, a field plate metal layer is deposited to form the field plate of the HFET device and the MISHFET gate. As described above, the etch stop dielectric layer remains disposed between the metal layer and the semiconductor substrate to define the MIS gate. To form the field plate, the metal layer is deposited in an area spaced from the opening in which the MIS gate is defined.

The field plate metal (or other metal) layer may include a multiple layer stack. In one example, the stack includes an initial Titanium layer followed by alternating layers of Nickel and Titanium for a total of six layers. Other metals may be used. For example, a metal other than Titanium that exhibits good adhesion may be used as the initial layer. One or more other metals exhibiting good conductivity may be used for the other layers.

In some embodiments, the etch stop dielectric layer is doped with Fluorine or other dopant to adjust the threshold voltage of the MISHFET device. For example, the dopant may be implanted during or after the dry etch procedure in act 714.

Described above are semiconductor devices having a MISHFET structure integrated with other structures having a Schottky junction through the selective etching of multiple surface passivation layers, including a dry-etchable dielectric layer and a wet-etchable dielectric layer under the first dielectric layer that acts as a dry etch stop. Schottky gates or other Schottky junction structures may be created on the same IC chip as the MIS gate through a wet etch of the etch stop dielectric layer. The integration of both Schottky and MIS devices may provide increased circuit functionality for use in, for instance, RF and high voltage switch GaN transistor applications. The MISHFET structure and MIS devices may be created without additional masking steps through the use of a field plate or other metal layer already used to form metal structures for the other device structures (e.g., Schottky-based structures, such as an HFET structure).

In a first aspect, a semiconductor device includes a semiconductor substrate including a heterostructure configured to support formation of a channel during operation, first and second dielectric layers supported by the semiconductor substrate, the second dielectric layer being disposed between the first dielectric layer and the semiconductor substrate, a gate supported by the semiconductor substrate, disposed in a first opening in the first dielectric layer, and to which a bias voltage is applied during operation to control current flow through the channel, the second dielectric layer being disposed between the gate and the semiconductor substrate, and an electrode supported by the semiconductor substrate, disposed in a second opening in the first and second dielectric layers, and configured to establish a Schottky junction with the semiconductor substrate.

In a second aspect, an electronic apparatus includes a semiconductor substrate including a heterostructure configured to support formation of a channel during operation, first and second dielectric layers supported by the semiconductor substrate, the second dielectric layer being disposed between the first dielectric layer and the semiconductor substrate, a gate supported by the semiconductor substrate, positioned in a first opening in the first dielectric layer, and disposed in a metal-insulator-semiconductor heterojunction field effect transistor (MISHFET) arrangement in which a bias voltage is applied to the gate during operation to control current flow through the channel, the second dielectric layer being disposed between the gate and the semiconductor substrate, and an electrode supported by the semiconductor substrate, disposed in a second opening in the first and second dielectric layers, and configured to establish a Schottky junction with the semiconductor substrate.

In a third aspect, a method of fabricating a semiconductor device includes depositing an etch stop dielectric layer on a surface of a semiconductor substrate comprising a heterostructure, depositing a passivation layer on the etch stop dielectric layer, defining a first opening by dry etching the passivation layer, removing the etch stop dielectric layer in the first opening via a wet etch, depositing a first metal layer in the first gate opening, the first metal layer being configured to establish a Schottky junction with the heterostructure of the semiconductor substrate, defining a second opening by dry etching the passivation layer, and depositing a second metal layer in the second opening, the etch stop dielectric layer being disposed between the second metal layer and the semiconductor substrate to define a metal-insulator-semiconductor heterojunction field effect transistor (MISHFET) gate.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A semiconductor device comprising: a substrate; first and second dielectric layers supported by the substrate, the second dielectric layer being disposed between the first dielectric layer and the substrate; a gate comprising a second metal layer supported by the substrate and disposed in a first opening in the first dielectric layer, the second dielectric layer being disposed between the gate and the substrate to form a metal-insulator gate configuration at a surface of the substrate; an electrode comprising a first metal layer, supported by the substrate, disposed in a second opening in the first and second dielectric layers, and disposed at the surface of the substrate and configured to establish a Schottky junction with the substrate; an inter-layer dielectric layer disposed over the electrode and first and second dielectric layers, wherein the gate is disposed within an opening in the inter-layer dielectric layer; and a field plate supported by the substrate, separate and distinct from the electrode, disposed adjacent the electrode, wherein the field plate comprises the second metal layer, and wherein the inter-layer dielectric layer is disposed between the field plate and the electrode.

2. The semiconductor device of claim 1, further comprising a further electrode supported by the substrate, disposed in a third opening in the first and second dielectric layers, configured to define an ohmic contact with the substrate, and spaced from the gate to define a current electrode of a metal-insulator-semiconductor heterojunction field effect transistor (MISHFET) structure comprising the gate.

3. The semiconductor device of claim 1, further comprising:
  a first pair of current electrodes supported by the substrate, spaced from the electrode, and configured to define a heterojunction field effect transistor (HFET) structure comprising the Schottky junction; and
  a second pair of current electrodes supported by the substrate, spaced from the gate, and configured to define a metal-insulator-semiconductor HFET (MISHFET) structure comprising the gate.

4. The semiconductor device of claim 3, wherein the HFET and MISHFET structures are coupled to one another in a cascode configuration.

5. The semiconductor device of claim 3, wherein the HFET and MISHFET structures are coupled to one another in a Doherty power amplifier circuit.

6. The semiconductor device of claim 1, further comprising first and second current electrodes supported by the substrate and spaced laterally outward from the Schottky junction and the gate to define a multiple-gate field effect transistor (FET) structure comprising the electrode and the gate.

7. The semiconductor device of claim 6, further comprising a current region in the substrate, disposed between the Schottky junction and the gate, and shared by FET structures of the multiple-gate FET structure.

8. The semiconductor device of claim 6, wherein the multiple-gate FET structure is configured as a dual-gate FET cascode amplifier.

9. The semiconductor device of claim 1, further comprising a current electrode supported by the substrate, spaced from the gate, and configured to define a metal-insulator-semiconductor heterojunction field effect transistor (MISHFET) structure comprising the gate, the current electrode, and a first current region in the substrate, wherein: the current electrode is disposed in a third opening in the first and second dielectric layers and is configured to define an ohmic contact with the first current region; and the Schottky junction is spaced from the gate and the current electrode.

10. The semiconductor device of claim 9, wherein the second dielectric layer comprises Fluorine-doped aluminum oxide such that the MISHFET structure is configured as a quasi-enhancement mode device.

11. The semiconductor device of claim 1, further comprising a current electrode supported by the substrate, spaced from the gate, disposed in a third opening in the first and second dielectric layers, and configured to define an ohmic contact with the substrate, wherein the current electrode and the electrode that establishes the Schottky junction are spaced from the gate to define a heterojunction field effect transistor (HFET).

12. The semiconductor device of claim 1, wherein the second dielectric layer comprises a material having an etch selectivity to block an etchant of the first dielectric layer from reaching the surface of the substrate.

13. An electronic apparatus comprising: a substrate; first and second dielectric layers supported by the substrate, the second dielectric layer being disposed between the first dielectric layer and the substrate; a gate comprising a second metal layer, supported by the substrate, positioned in a first opening in the first dielectric layer, and disposed in a metal-insulator-semiconductor heterojunction field effect transistor (MISHFET) arrangement, the second dielectric layer being disposed between the gate and the substrate; an electrode comprising a first metal layer, supported by the substrate, disposed in a second opening in the first and second dielectric layers, and configured to establish a Schottky junction with the substrate; an inter-layer dielectric layer disposed over the electrode and first and second dielectric layers, wherein the gate is disposed within an opening in the inter-layer dielectric layer; and a field plate supported by the substrate, separate and distinct from the electrode, and disposed adjacent the electrode, wherein the field plate comprises the second metal layer, and wherein the inter-layer dielectric layer is disposed between the field plate and the electrode.

14. The electronic apparatus of claim 13, further comprising:
  a first pair of current electrodes supported by the substrate, spaced from the electrode, and configured to define a heterojunction field effect transistor (HFET) structure comprising the Schottky junction; and
  a second pair of current electrodes supported by the substrate and spaced from the gate and configured to define a MISHFET structure of the MISHFET arrangement, the MISHFET structure comprising the gate.

15. The electronic apparatus of claim 14, wherein the HFET and MISHFET structures are coupled to one another in a cascode configuration or to form a Doherty power amplifier.

16. The electronic apparatus of claim 13, further comprising first and second current electrodes supported by the substrate and spaced laterally outward from the Schottky junction and the gate to define a multiple-gate field effect transistor (FET) structure comprising the electrode and the gate.

17. The electronic apparatus of claim 13, further comprising a current electrode supported by the substrate, spaced from the gate, disposed in a third opening in the first and second dielectric layers, and configured to define an ohmic contact with the substrate, wherein the current electrode and the electrode that establishes the Schottky junction are spaced from the gate to define the MISHFET arrangement.

18. The electronic apparatus of claim 13, further comprising: a current electrode supported by the substrate, spaced from the gate, disposed in a third opening in the first and second dielectric layers, and configured to define an ohmic contact with the substrate.

19. A semiconductor device comprising: a substrate comprising a heterostructure configured to support formation of a channel during operation; first and second dielectric layers supported by the substrate, the second dielectric layer being disposed between the first dielectric layer and the substrate; a gate comprising a first metal layer supported by the substrate and disposed in a first opening in the first dielectric layer, the second dielectric layer being disposed between the gate and the substrate to form a metal-insulator gate configuration at a surface of the substrate; a gate electrode comprising a second metal layer, supported by the substrate, disposed in a second opening in the first and second dielectric layers, and disposed at the surface of the substrate and configured to establish a Schottky junction with the substrate; and an inter-layer dielectric layer disposed over the gate electrode and first and second dielectric layers, wherein the gate is disposed within an opening in the inter-layer dielectric layer, and wherein a portion of the gate is over a portion of the inter-layer dielectric layer.

20. The semiconductor device of claim 19, further comprising a further electrode supported by the substrate, disposed in a third opening in the first and second dielectric layers, configured to define an ohmic contact with the substrate, and spaced from the gate to define a current electrode of a metal-insulator-semiconductor heterojunction field effect transistor (MISHFET) structure comprising the gate.

21. The semiconductor device of claim 19, further comprising: a first pair of current electrodes supported by the substrate, spaced from the gate electrode, and configured to define a heterojunction field effect transistor (HFET) structure comprising the Schottky junction; and a second pair of current electrodes supported by the substrate, spaced from the gate, and configured to define a metal-insulator-semiconductor HFET (MISHFET) structure comprising the gate.

22. The semiconductor device of claim 19, further comprising a current electrode supported by the substrate, spaced from the gate, and configured to define a MISHFET structure, the MISHFET structure comprising the gate, the current electrode, and a first current region in the substrate, wherein: the current electrode is disposed in a third opening of the first and second dielectric layers and is configured to define an ohmic contact with the first current region; and the Schottky junction is spaced from the gate and the current electrode.

* * * * *